United States Patent
Ito

(10) Patent No.: US 11,164,761 B2
(45) Date of Patent: Nov. 2, 2021

(54) HEAT TREATMENT METHOD AND HEAT TREATMENT APPARATUS OF LIGHT IRRADIATION TYPE

(71) Applicant: SCREEN Holdings Co., Ltd., Kyoto (JP)

(72) Inventor: Yoshio Ito, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/701,296

(22) Filed: Dec. 3, 2019

(65) Prior Publication Data

US 2020/0243357 A1 Jul. 30, 2020

(30) Foreign Application Priority Data

Jan. 28, 2019 (JP) .............................. JP2019-012340

(51) Int. Cl.
*H01L 21/761* (2006.01)
*H01L 21/67* (2006.01)
*H01L 21/687* (2006.01)

(52) U.S. Cl.
CPC .. *H01L 21/67115* (2013.01); *H01L 21/68707* (2013.01); *H01L 21/68742* (2013.01)

(58) Field of Classification Search
CPC ............. H01L 21/67115; H01L 21/324; H01L 21/67745; H01L 21/67778; H01L 21/67248; H01L 21/67253; H01L 21/68707
USPC ........................................................ 438/795
See application file for complete search history.

(56) References Cited

U.S. PATENT DOCUMENTS

2017/0125312 A1 5/2017 Ono
2017/0194220 A1* 7/2017 Lieberer ........... H01L 21/67248
2018/0261477 A1 9/2018 Ito

FOREIGN PATENT DOCUMENTS

JP 2017-092102 A 5/2017
TW 201834072 A 9/2018

OTHER PUBLICATIONS

Office Action dated Jul. 6, 2020 in corresponding Taiwanese Patent Application No. 108142063 and Search Report with partial English translation based on attached Japanese translation.

(Continued)

*Primary Examiner* — Vu A Vu
(74) *Attorney, Agent, or Firm* — Ostrolenk Faber LLP

(57) ABSTRACT

After treatment of a preceding lot is completed, warm up treatment is started. In the warm up treatment, an in-chamber structure such as a susceptor is kept at a constant heat-retaining temperature by light irradiation from a halogen lamp. When a signal to pay out a lot is received while the warm up treatment is performed, the treatment proceeds to conditioning treatment. In the conditioning treatment, the in-chamber structure like the susceptor and so on is temperature-controlled to a stable temperature by repeatedly performing light irradiation on a dummy wafer held on the susceptor, the light irradiation being similar to that performed on a semiconductor wafer included in a lot to be treated. Performing the conditioning treatment after the warm up treatment is performed enables the in-chamber structure to be temperature-controlled to the stable temperature in a short time.

10 Claims, 11 Drawing Sheets

(56) References Cited

OTHER PUBLICATIONS

Decision of Refusal dated Feb. 19, 2021 in corresponding Taiwanese Patent Application No. 108142063 with partial English translation based on attached Japanese translation.
Notification of Reason for Refusal dated Jul. 9, 2021 in corresponding Korean Patent Application No. 10-2019-0164652 with English translation obtained from the JPO.

* cited by examiner

F I G. 6
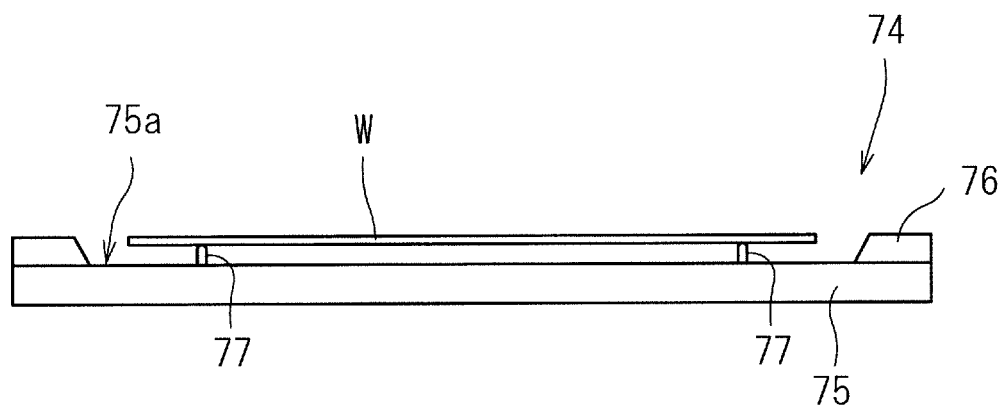

F I G. 8
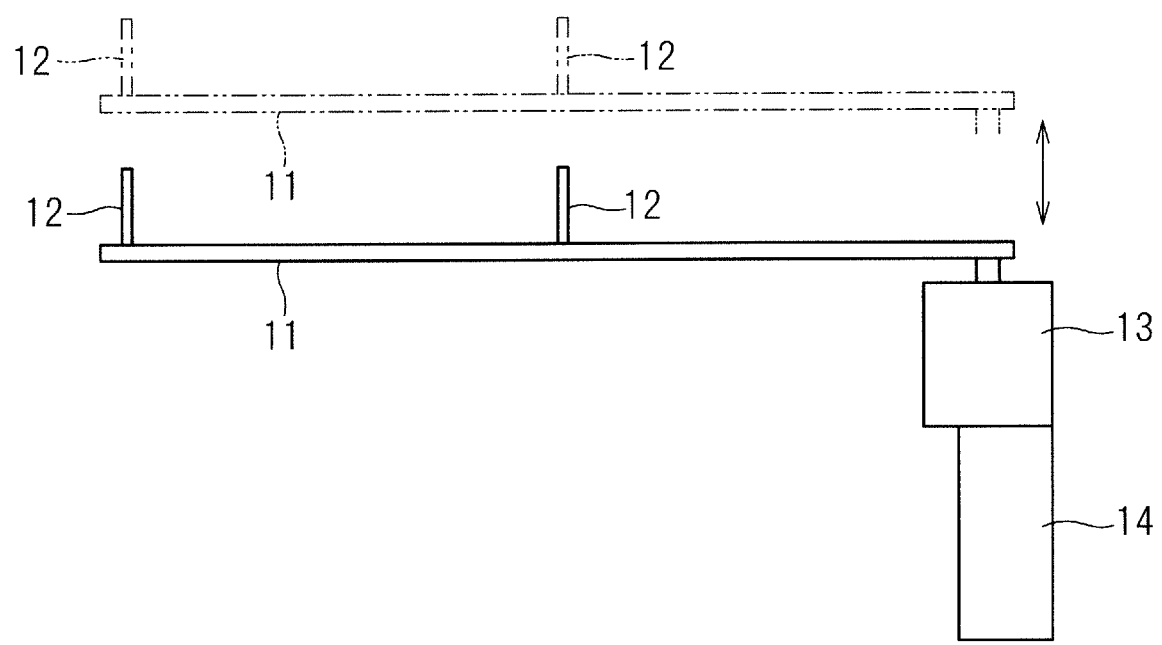

F I G . 1 0
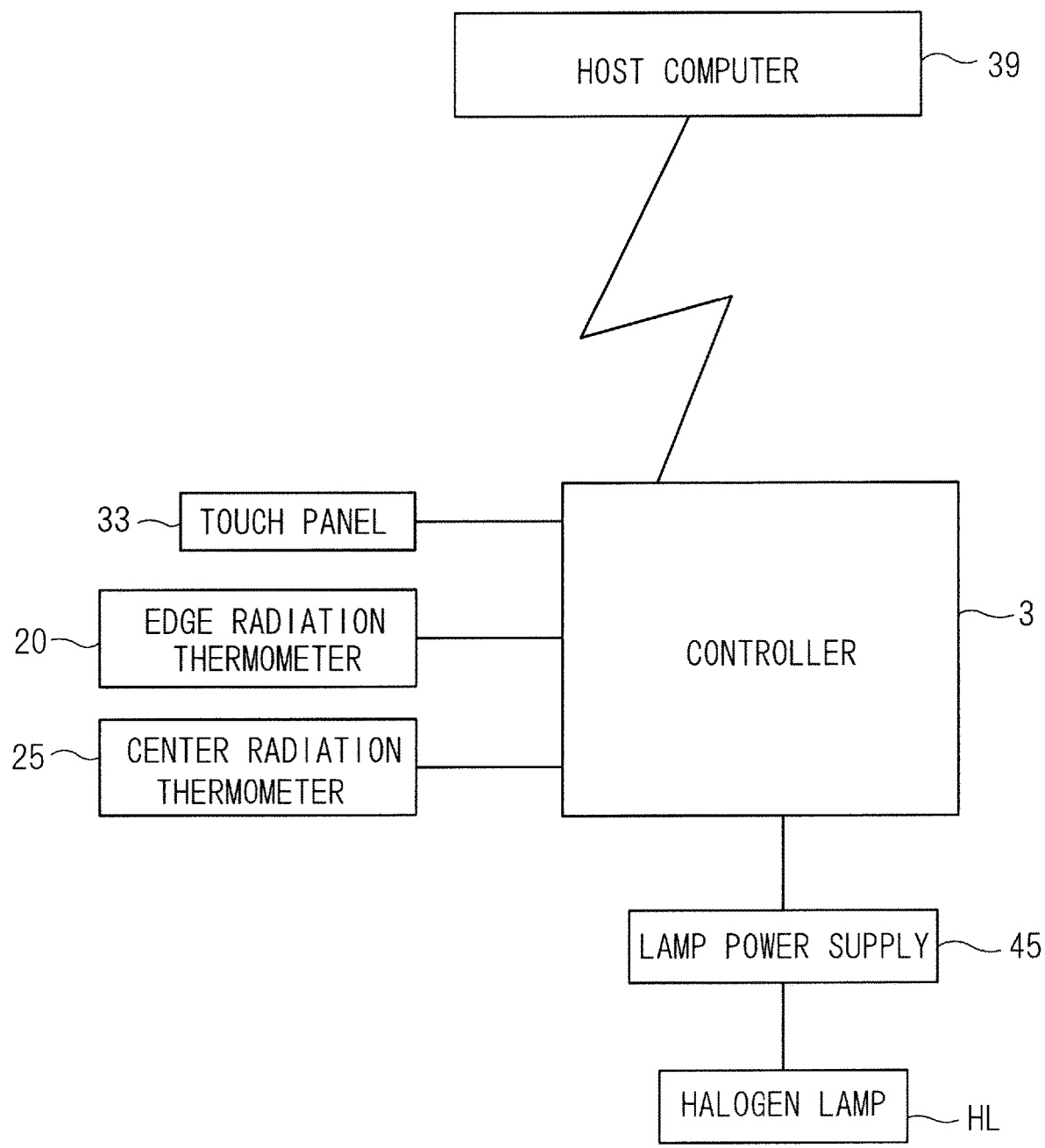

HEAT TREATMENT METHOD AND HEAT TREATMENT APPARATUS OF LIGHT IRRADIATION TYPE

BACKGROUND OF THE INVENTION

Field of the invention

The present invention relates to a heat treatment method and a heat treatment apparatus, for irradiating a thin-plated precision electronic substrate (hereinafter referred to as simply "substrate") such as a semiconductor wafer with light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of a surface of a semiconductor wafer implanted with impurities by an ion implantation process with a flash of light emitted from flash lamps allows the temperature rise only in the surface of the semiconductor wafer to an activation temperature for an extremely short time, thereby achieving only the activation of the impurities without deep diffusion of the impurities.

Typically, not only heat treatment but also processing or treatment of semiconductor wafers is performed lot by lot (a group of semiconductor wafers subjected to the same processing or treatment under the same conditions). In a single-wafer type substrate processing apparatus, semiconductor wafers in a lot are processed sequentially in succession. In a flash lamp annealer, semiconductor wafers in a lot are also transported one by one into a chamber and heat-treated sequentially.

Unfortunately, the temperature of in-chamber structures (structures in a chamber) including a susceptor for holding a semiconductor wafer and the like changes in some cases in the course of the sequential processing or treatment of semiconductor wafers in a lot. Such a phenomenon occurs when new treatment starts in a flash lamp annealer which has been in a nonoperational condition for some time or when treatment conditions including a treatment temperature of semiconductor wafers and the like are changed. Changes in temperature of the in-chamber structures including the susceptor and the like in the course of the treatment of semiconductor wafers in a lot give rise to a problem that there arises a difference in temperature history during the treatment between initial semiconductor wafers and latter semiconductor wafers in the lot.

To solve such a problem, it has been common practice that dummy wafers not to be treated are transported into the chamber and supported by the susceptor prior to the start of the treatment of a product lot, and heating treatment is performed on the dummy wafers, whereby the temperature of the in-chamber structures including the susceptor and the like is increased in advance (dummy running). U.S. Patent Application Publication No. 2017/0125312 discloses that the dummy running is performed on approximately ten dummy wafers, so that the temperature of the in-chamber structures including the susceptor and the like reaches a stable temperature during the processing.

However, a long time is required to raise the temperature of the in-chamber structures like the susceptor and so on cooled to about room temperature to a stable temperature by dummy running. As a result, there is caused a problem of increase in waiting time until the processing of a product lot is started and decrease in throughput.

SUMMARY OF THE INVENTION

The present invention is intended for a heat treatment method for irradiating a substrate with light to heat the substrate.

According to one aspect of the present invention, the heat treatment method includes the following steps: (a) transporting a substrate into a chamber; (b) irradiating the substrate held by a susceptor in the chamber with light; (c) keeping a structure in the chamber at a constant heat-retaining temperature by irradiation with light from a continuous lighting lamp before a first substrate of a lot is transported into the chamber; and (d) controlling temperature of the structure by repeatedly turning on and off the continuous lighting lamp after the step (c).

The structure in the chamber having increased in temperature to the heat-retaining temperature is temperature-controlled, so that the structure in the chamber can be temperature-controlled to a stable temperature in a short time.

The present invention also intends for a heat treatment apparatus for irradiating a substrate with light to heat the substrate.

According to another aspect of the present invention, the heat treatment apparatus includes: a chamber that accommodates a substrate; a susceptor that holds the substrate in the chamber; a continuous lighting lamp that irradiates the substrate held by the susceptor with light; and a controller that controls output from the continuous lighting lamp, wherein the structure in the chamber is maintained at a constant heat-retaining temperature by light irradiation from the continuous lighting lamp in a heat-retaining step, and thereafter the structure is temperature-controlled by repeatedly turning on and off the continuous lighting lamp in a temperature control step before a first substrate of a lot is transported to the chamber.

The structure in the chamber having increased in temperature to the heat-retaining temperature is temperature-controlled, so that the structure in the chamber can be temperature-controlled to a stable temperature in a short time.

Thus, an object of the present invention is to temperature-control an in-chamber structure to a stable temperature in a short time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a sectional view of the susceptor;
FIG. 8 is a side view of the transfer mechanism;
FIG. 10 is a block diagram showing a configuration of a controller.

DESCRIPTION OF THE PREFERRED EMBODIMENTS

A preferred embodiment according to the present invention will now be described in detail with reference to the drawings.

Figure 1:
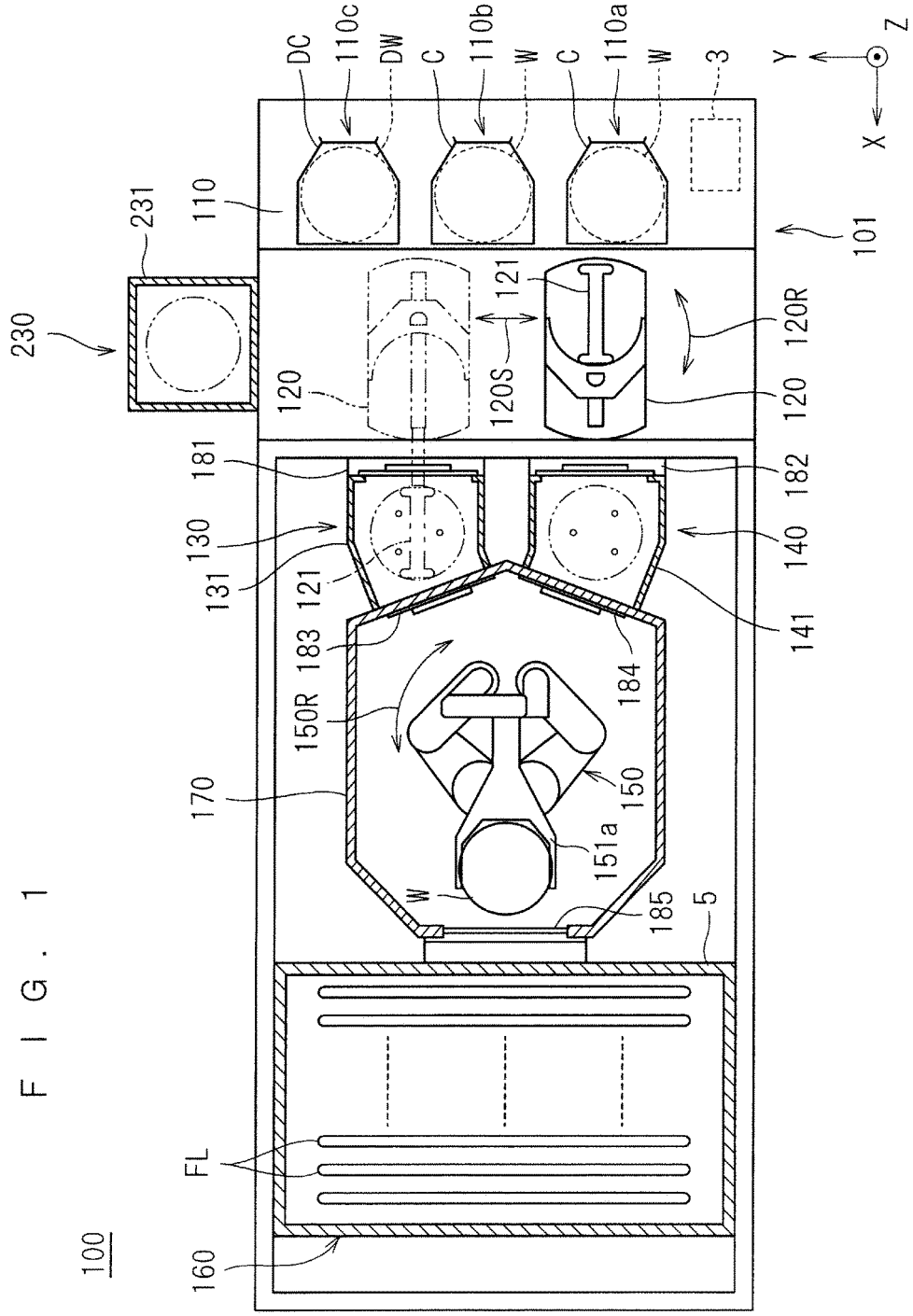
FIG. 1 is a plan view of a heat treatment apparatus according to the present invention.
Figure 2:
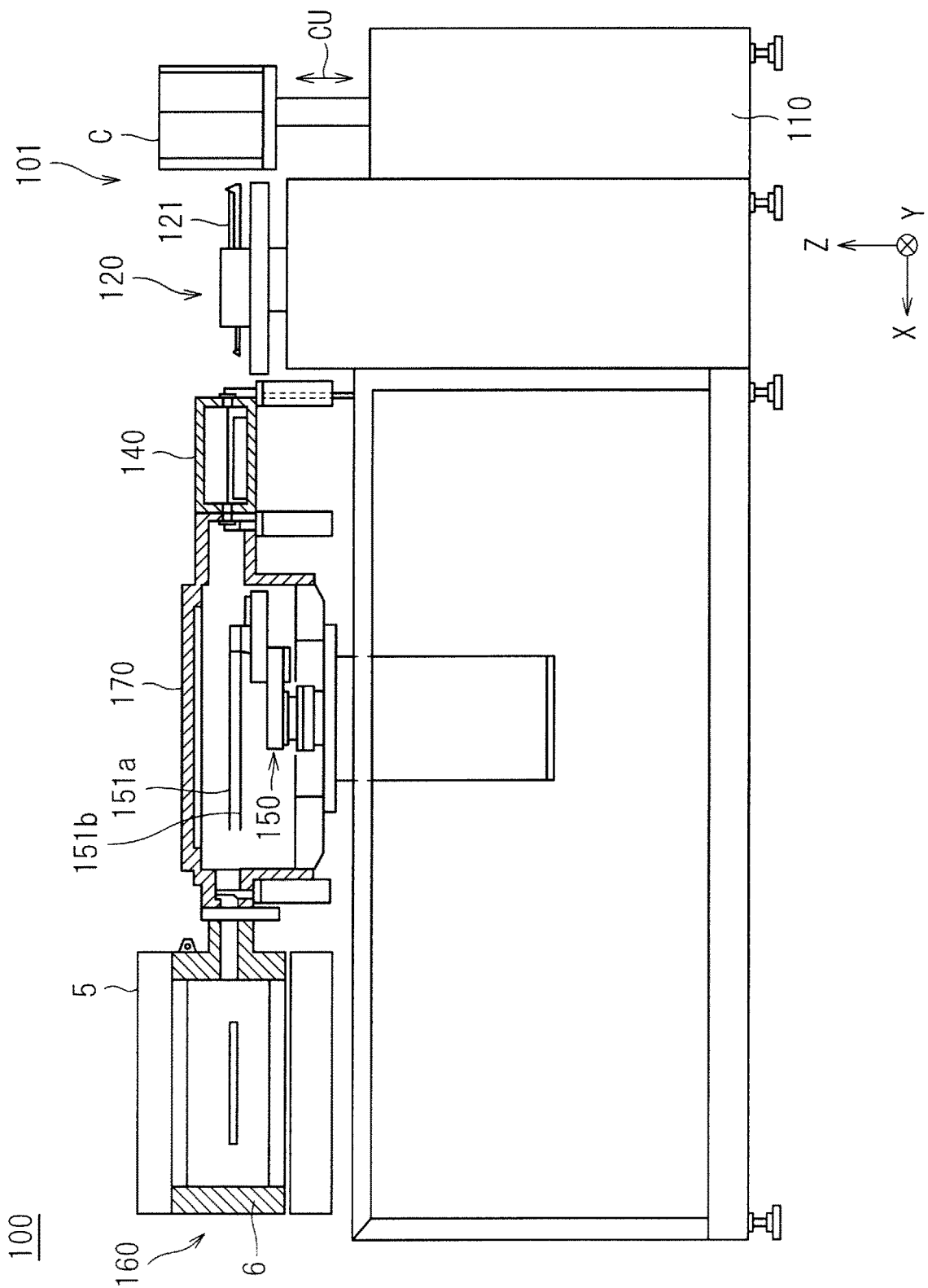
FIG. 2 is a front view of the heat treatment apparatus of FIG. 1.

First, a heat treatment apparatus according to the present invention will be described. FIG. 1 is a plan view of a heat treatment apparatus 100 according to the present invention, and FIG. 2 is a front view of the heat treatment apparatus 100. The heat treatment apparatus 100 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. The semiconductor wafer W prior to the transport into the heat treatment apparatus 100 is implanted with impurities. The heat treatment apparatus 100 performs heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding. An XYZ rectangular coordinate system in which an XY plane is defined as a horizontal plane and a Z axis is defined to extend in a vertical direction is additionally shown in FIGS. 1 to 3 for purposes of clarifying the directional relationship therebetween.

As shown in FIGS. 1 and 2, the heat treatment apparatus 100 includes: an indexer part 101 for transporting untreated semiconductor wafers W from the outside into the heat treatment apparatus 100 and for transporting treated semiconductor wafers W to the outside of the heat treatment apparatus 100; an alignment part 230 for positioning an untreated semiconductor wafer W; two cooling parts 130 and 140 for cooling semiconductor wafers W subjected to the heating treatment; a heat treatment part 160 for performing flash heating treatment on a semiconductor wafer W; and a transport robot 150 for transferring a semiconductor wafer W to and from the cooling parts 130 and 140 and the heat treatment part 160. The heat treatment apparatus 100 further includes a controller 3 for controlling operating mechanisms provided in the aforementioned processing parts and the transport robot 150 to cause the flash heating treatment of the semiconductor wafer W to proceed.

The indexer part 101 includes: a load port 110 for placing thereon a plurality of carriers (or cassettes) C arranged in juxtaposition; and a transfer robot 120 for taking an untreated semiconductor wafer W out of each of the carriers C and for storing a treated semiconductor wafer W into each of the carriers C. To be precise, the indexer part 101 includes three load ports, and the load port 110 is a collective designation for a first load port 110a, a second load port 110b, and a third load port 110c (when the three load ports are not particularly distinguished, the three load ports are each simply referred to as the load port 110). Carriers C in which semiconductor wafers W (also referred to as product wafers W) that become products are stored are placed on the first load port 110a and the second load port 110b. On the other hand, the third load port 110c is a load port exclusive to a dummy carrier DC in which dummy wafers DW are stored. That is, only the dummy carrier DC is placed on the third load port 110c. Typically, the dummy carrier DC containing a plurality of dummy wafers DW is always placed on the third load port 110c.

An unmanned transport vehicle (an AGV (automatic guided vehicle) or an OHT (overhead hoist transfer)) or the like transports a carrier C with untreated semiconductor wafers W stored therein and the dummy carrier DC to place the carrier C and the dummy carrier DC on the load port 110. The unmanned transport vehicle also carries a carrier C with treated semiconductor wafers W stored therein and the dummy carrier DC away from the load port 110.

In the load port 110, the carriers C and the dummy carrier DC are movable upwardly and downwardly as indicated by an arrow CU in FIG. 2 so that the transfer robot 120 is able to load any semiconductor wafer W (or any dummy wafer DW) into each of the carriers C and the dummy carrier DC and unload any semiconductor wafer W (or any dummy wafer DW) from each of the carriers C and the dummy carrier DC. The carriers C and the dummy carrier DC may be of the following types: an SMIF (standard mechanical interface) pod and an OC (open cassette) which exposes stored semiconductor wafer W to the outside atmosphere, in addition to a FOUP (front opening unified pod) which stores semiconductor wafer W in an enclosed or sealed space.

The transfer robot 120 is slidable as indicated by an arrow 120S in FIG. 1, pivotable as indicated by an arrow 120R in FIG. 1, and movable upwardly and downwardly. Thus, the transfer robot 120 loads and unloads semiconductor wafers W into and from the carriers C and the dummy carrier DC, and transfers semiconductor wafers W to and from the alignment part 230 and the two cooling parts 130 and 140. The operation of the transfer robot 120 loading and unloading the semiconductor wafers W into and from the carriers C (or the dummy carrier DC) is achieved by the sliding movement of a hand 121 of the transfer robot 120 and the upward and downward movement of the carriers C. The transfer of the semiconductor wafers W between the transfer robot 120 and the alignment part 230 or between the transfer robot 120 and the cooling parts 130 and 140 is achieved by the sliding movement of the hand 121 and the upward and downward movement of the transfer robot 120.

The alignment part 230 is provided on and connected to one side of the indexer part 101 in adjacent relation thereto along the Y axis. The alignment part 230 is a processing part for rotating a semiconductor wafer W in a horizontal plane to an orientation appropriate for flash heating. The alignment part 230 includes an alignment chamber 231 which is a housing made of an aluminum alloy, a mechanism provided in the alignment chamber 231 and for supporting and rotating a semiconductor wafer W in a horizontal attitude, a mechanism provided in the alignment chamber 231 and for optically detecting a notch, an orientation flat, and the like formed in a peripheral portion of a semiconductor wafer W, and the like.

The transfer robot 120 transfers a semiconductor wafer W to and from the alignment part 230. The semiconductor wafer W with the center thereof in a predetermined position is transferred from the transfer robot 120 to the alignment chamber 231. The alignment part 230 rotates the semiconductor wafer W received from the indexer part 101 about a vertical axis passing through the central portion of the semiconductor wafer W to optically detect a notch and the like, thereby adjusting the orientation of the semiconductor wafer W. The semiconductor wafer W subjected to the orientation adjustment is taken out of the alignment chamber 231 by the transfer robot 120.

A transport chamber 170 for housing the transport robot 150 therein is provided as space for transport of the semiconductor wafer W by means of the transport robot 150. A treatment chamber 6 in the heat treatment part 160, a first cool chamber 131 in the cooling part 130, and a second cool chamber 141 in the cooling part 140 are connected in communication with three sides of the transport chamber 170.

The heat treatment part 160 which is a principal part of the heat treatment apparatus 100 is a substrate processing part for irradiating a preheated semiconductor wafer W with flashes of light from xenon flash lamps FL to perform flash heating treatment on the semiconductor wafer W. The configuration of the heat treatment part 160 will be described later in detail.

The two cooling parts 130 and 140 are substantially similar in configuration to each other. The cooling parts 130 and 140 include respective metal cooling plates and respective quartz plates (both not shown) placed on the upper surfaces of the cooling plates in the first and second cool chambers 131 and 141 which are housings made of an aluminum alloy. Each of the cooling plates is temperature-controlled at ordinary temperatures (approximately 23° C.) by a Peltier element or by circulation of constant-temperature water. The semiconductor wafer W subjected to the flash heating treatment in the heat treatment part 160 is transported into the first cool chamber 131 or the second cool chamber 141, and is then placed and cooled on a corresponding one of the quartz plate.

The first cool chamber 131 and the second cool chamber 141 provided between the indexer part 101 and the transport chamber 170 are connected to both the indexer part 101 and the transport chamber 170. Each of the first cool chamber 131 and the second cool chamber 141 has two openings for transporting the semiconductor wafer W thereinto and therefrom. One of the openings of the first cool chamber 131 which is connected to the indexer part 101 is openable and closable by a gate valve 181. The other opening of the first cool chamber 131 which is connected to the transport chamber 170 is openable and closable by a gate valve 183. In other words, the first cool chamber 131 and the indexer part 101 are connected to each other through the gate valve 181, and the first cool chamber 131 and the transport chamber 170 are connected to each other through the gate valve 183.

The gate valve 181 is opened when the semiconductor wafer W is transferred between the indexer part 101 and the first cool chamber 131. The gate valve 183 is opened when the semiconductor wafer W is transferred between the first cool chamber 131 and the transport chamber 170. When the gate valve 181 and the gate valve 183 are closed, the interior of the first cool chamber 131 is an enclosed space.

One of the two openings of the second cool chamber 141 which is connected to the indexer part 101 is openable and closable by a gate valve 182. The other opening of the second cool chamber 141 which is connected to the transport chamber 170 is openable and closable by a gate valve 184. In other words, the second cool chamber 141 and the indexer part 101 are connected to each other through the gate valve 182, and the second cool chamber 141 and the transport chamber 170 are connected to each other through the gate valve 184.

The gate valve 182 is opened when the semiconductor wafer W is transferred between the indexer part 101 and the second cool chamber 141. The gate valve 184 is opened when the semiconductor wafer W is transferred between the second cool chamber 141 and the transport chamber 170. When the gate valve 182 and the gate valve 184 are closed, the interior of the second cool chamber 141 is an enclosed space.

The cooling parts 130 and 140 further include respective gas supply mechanisms for supplying clean nitrogen gas to the first and second cool chambers 131 and 141 and respective exhaust mechanisms for exhausting atmospheres from the first and second cool chambers 131 and 141. The gas supply mechanisms and the exhaust mechanisms may be capable of changing the flow rates thereof in two levels.

The transport robot 150 provided in the transport chamber 170 is pivotable about a vertical axis as indicated by an arrow 150R. The transport robot 150 includes two linkage mechanisms comprised of a plurality of arm segments. Transport hands 151a and 151b each for holding a semiconductor wafer W are provided at respective distal ends of the two linkage mechanisms. These transport hands 151a and 151b are vertically spaced a predetermined distance apart from each other, and are independently linearly slidable in the same horizontal direction by the respective linkage mechanisms. The transport robot 150 moves a base provided with the two linkage mechanisms upwardly and downwardly to thereby move the two transport hands 151a and 151b spaced the predetermined distance apart from each other upwardly and downwardly.

When the transport robot 150 transfers (loads and unloads) a semiconductor wafer W to and from the first cool chamber 131, the second cool chamber 141, or the treatment chamber 6 in the heat treatment part 160 as a transfer target, both of the transport hands 151a and 151b pivot into opposed relation to the transfer target, and move upwardly or downwardly after (or during) the pivotal movement, so that one of the transport hands 151a and 151b reaches a vertical position at which the semiconductor wafer W is to be transferred to and from the transfer target. Then, the transport robot 150 causes the transport hand 151a (or 151b) to linearly slide in a horizontal direction, thereby transferring the semiconductor wafer W to and from the transfer target.

The transfer of a semiconductor wafer W between the transport robot 150 and the transfer robot 120 is performed through the cooling parts 130 and 140. That is, the first cool chamber 131 in the cooling part 130 and the second cool chamber 141 in the cooling part 140 function also as paths for transferring a semiconductor wafer W between the transport robot 150 and the transfer robot 120. Specifically, one of the transport robot 150 and the transfer robot 120 transfers a semiconductor wafer W to the first cool chamber 131 or the second cool chamber 141, and the other of the transport robot 150 and the transfer robot 120 receives the semiconductor wafer W, whereby the transfer of the semiconductor wafer W is performed. The transport robot 150 and the transfer robot 120 constitute a transport mechanism for transporting a semiconductor wafer W from the carriers C to the heat treatment part 160.

As mentioned above, the gate valves 181 and 182 are provided between the indexer part 101 and the first and second cool chambers 131 and 141, respectively. The gate valves 183 and 184 are provided between the transport chamber 170 and the first and second cool chambers 131 and 141, respectively. A gate valve 185 is further provided between the transport chamber 170 and the treatment chamber 6 of the heat treatment part 160. These gate valves 181 to 185 are opened and closed, as appropriate, when the semiconductor wafer W is transported in the heat treatment apparatus 100. Nitrogen gas is supplied from a gas supply part to the transport chamber 170 and the alignment chamber 231, and an exhaust part exhausts atmospheres from the transport chamber 170 and the alignment chamber 231 (both not shown).

Figure 3:
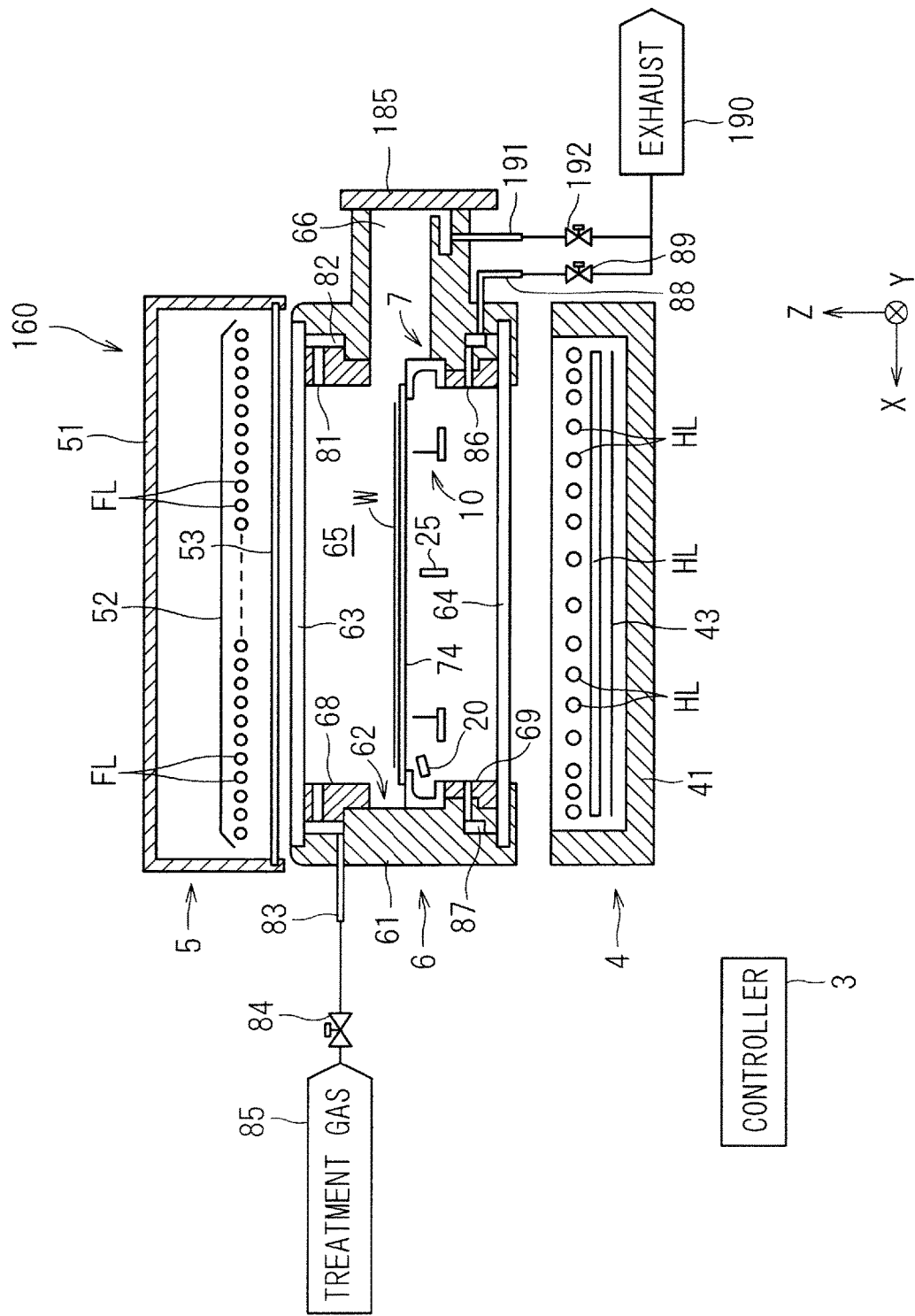
FIG. 3 is a longitudinal sectional view showing a configuration of a heat treatment part.

Next, the configuration of the heat treatment part 160 will be described. FIG. 3 is a longitudinal sectional view showing the configuration of the heat treatment part 160. The heat treatment part 160 includes the treatment chamber 6 for receiving a semiconductor wafer W therein to perform heating treatment on the semiconductor wafer W, a flash lamp house 5 including the plurality of built-in flash lamps FL, and a halogen lamp house 4 including a plurality of built-in halogen lamps HL. The flash lamp house 5 is provided over the treatment chamber 6, and the halogen lamp house 4 is provided under the treatment chamber 6. The heat treatment part 160 further includes a holder 7 provided inside the treatment chamber 6 and for holding a semiconductor wafer W in a horizontal attitude, and a transfer mechanism 10 provided inside the treatment chamber 6 and for transferring a semiconductor wafer W between the holder 7 and the transport robot 150.

The treatment chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the treatment chamber 6 is a disk-shaped member made of quartz, and serves as a quartz window that transmits flashes of light emitted from the flash lamps FL therethrough into the treatment chamber 6. The lower chamber window 64 forming the floor of the treatment chamber 6 is also a disk-shaped member made of quartz, and serves as a quartz window that transmits light emitted from the halogen lamps HL therethrough into the treatment chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the treatment chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the treatment chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the treatment chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the treatment chamber 6. The transport opening 66 is openable and closable by the gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the treatment chamber 6 is an enclosed space.

At least one gas supply opening 81 for supplying a treatment gas therethrough into the heat treatment space 65 is provided in an upper portion of the inner wall of the treatment chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the treatment chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), and reactive gases such as hydrogen ($H_2$) and ammonia ($NH_3$) (although nitrogen is used in the present preferred embodiment).

At least one gas exhaust opening 86 for exhausting a gas from the heat treatment space 65 is provided in a lower portion of the inner wall of the treatment chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the treatment chamber 6. The gas exhaust pipe 88 is connected to an exhaust mechanism 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the treatment chamber 6, and may be in the form of slits. The treatment gas supply source 85 and the exhaust mechanism 190 may be mechanisms provided in the heat treatment apparatus 100 or be utility systems in a factory in which the heat treatment apparatus 100 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. By opening the valve 192, the gas in the treatment chamber 6 is exhausted through the transport opening 66.

Figure 4:
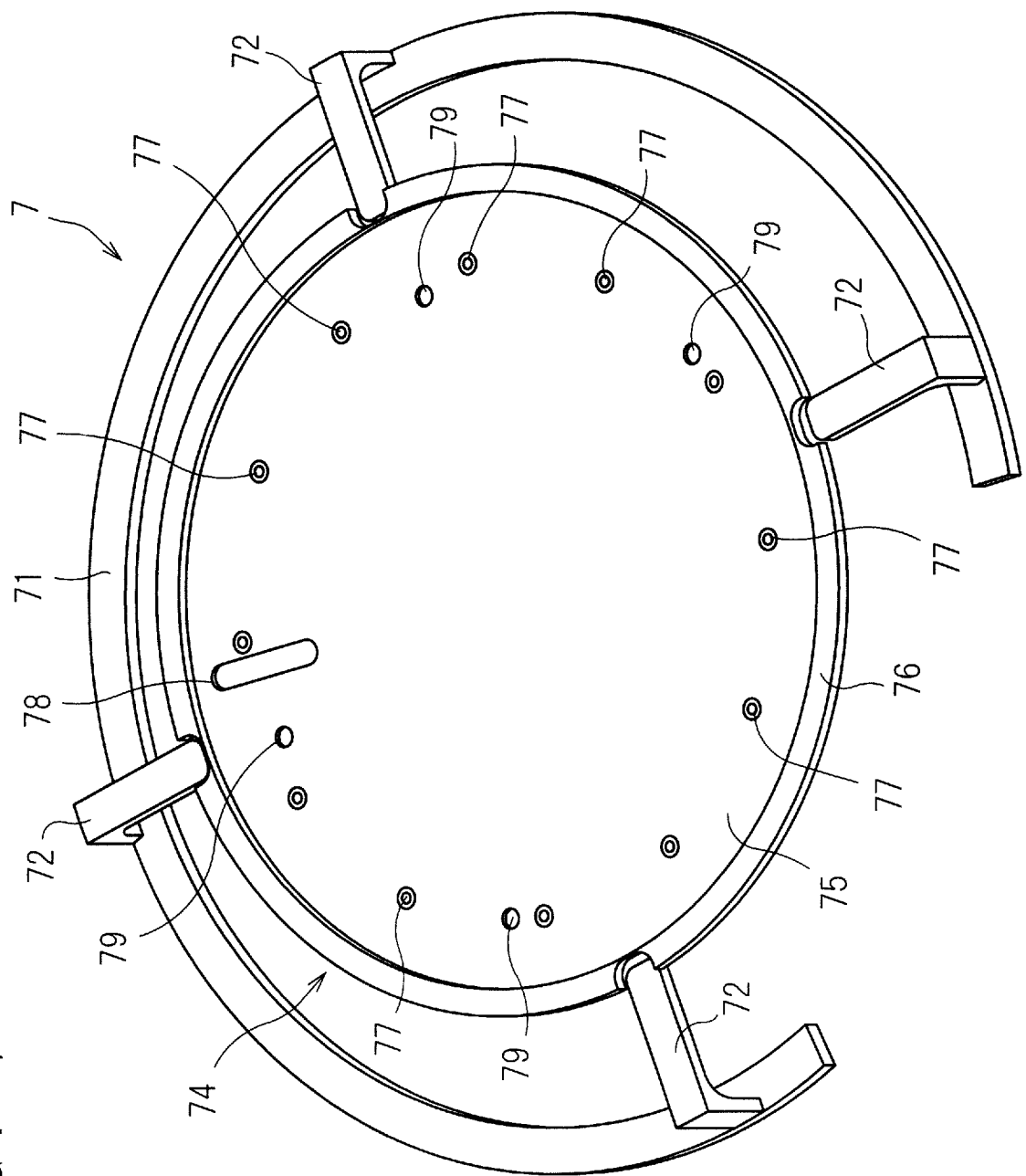
FIG. 4 is a perspective view showing the entire external appearance of a holder.

FIG. 4 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the treatment chamber 6 by being placed on the bottom surface of the recessed portion 62 (with reference to FIG. 3). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 5:
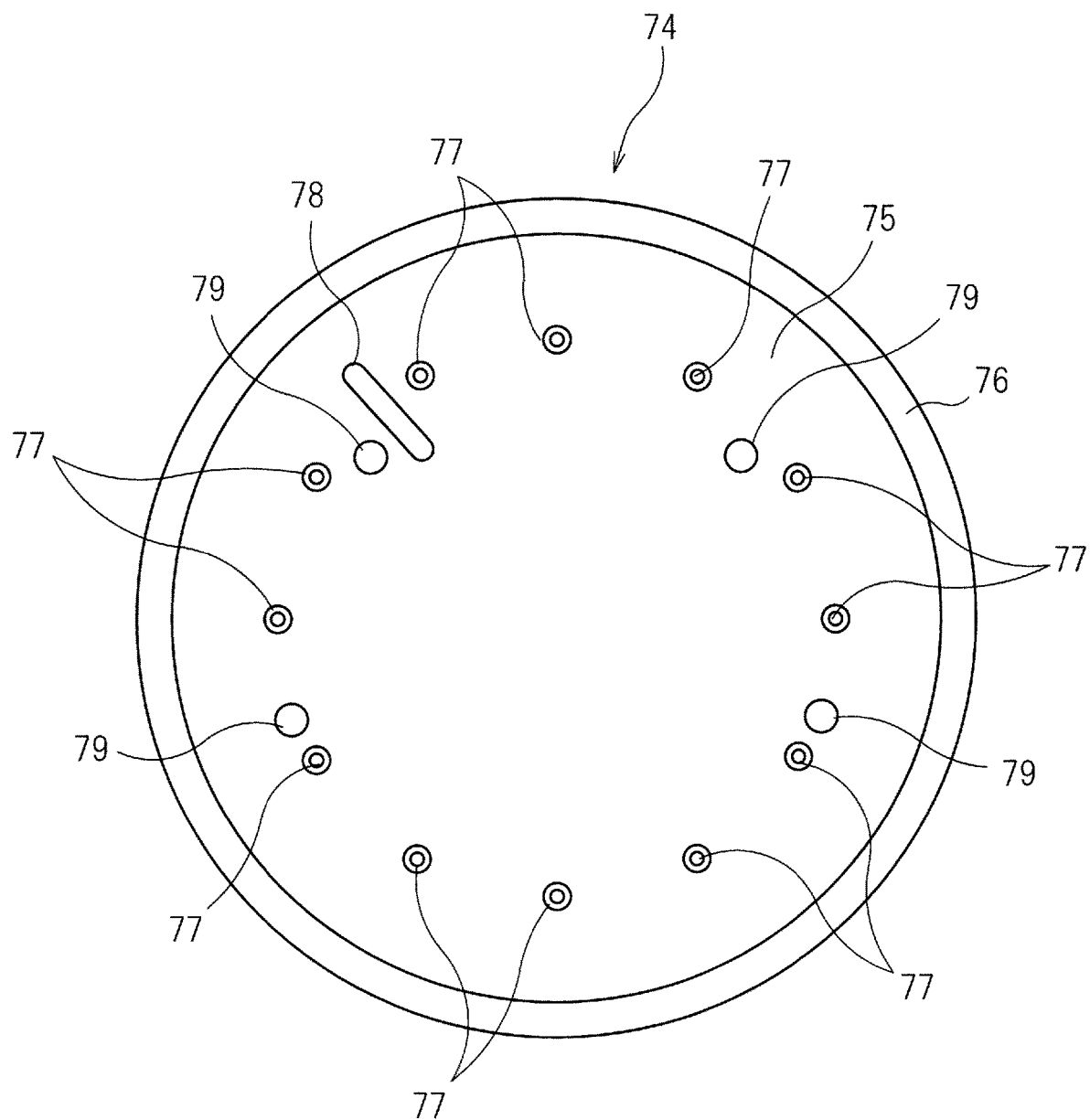
FIG. 5 is a plan view of a susceptor.

The susceptor 74 is supported by the four coupling portions 72 provided on the base ring 71. FIG. 5 is a plan view of the susceptor 74. FIG. 6 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 4, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the treatment chamber 6, whereby the holder 7 is mounted to the treatment chamber 6. With the holder 7 mounted to the treatment chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the treatment chamber 6 is placed and held in a horizontal attitude on the susceptor 74 of the holder 7 mounted to the treatment chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 4 and 5, an opening 78 is provided in the holding plate 75 of the susceptor 74 so as to extend vertically through the holding plate 75 of the susceptor 74. The opening 78 is provided for an edge radiation thermometer 20 (with reference to FIG. 3) to receive radiation (infrared radiation) emitted from the lower surface of the semiconductor wafer W held by the susceptor 74. Specifically, the edge radiation thermometer 20 receives the radiation emitted from the lower surface of the semiconductor wafer W held by the susceptor 74 through the opening 78 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 7:
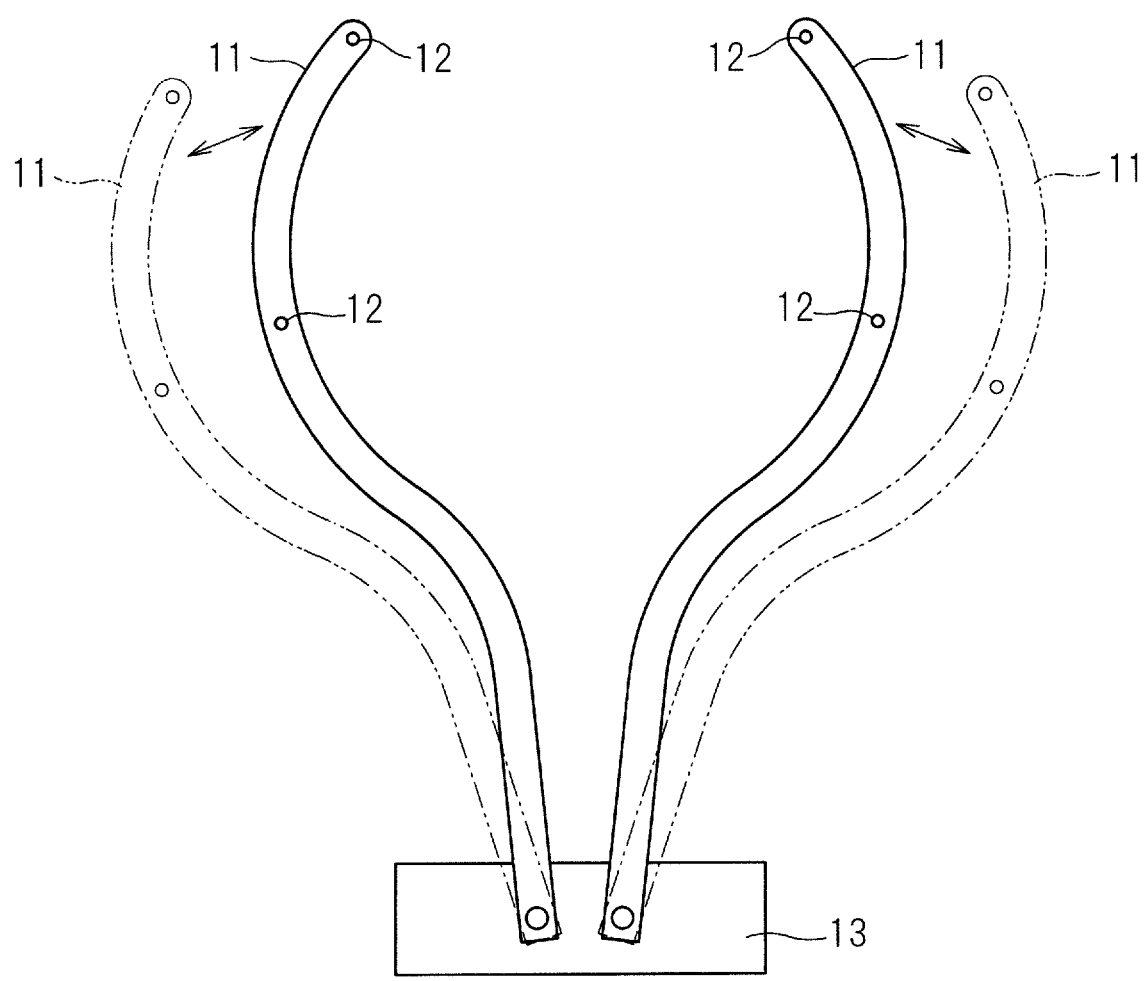
FIG. 7 is a plan view of a transfer mechanism.

FIG. 7 is a plan view of the transfer mechanism 10. FIG. 8 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 7) in which a semiconductor wafer W is transferred to and from the holder 7 and a retracted position (a position indicated by dash-double-dot lines in FIG. 7) in which the transfer arms 11 do not overlap the semiconductor wafer W held by the holder 7 as seen in plan view. The transfer operation position is under the susceptor 74, and the retracted position is outside the susceptor 74. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 4 and 5) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the treatment chamber 6.

Referring again to FIG. 3, the heat treatment part 160 includes two radiation thermometers: the edge radiation thermometer (edge pyrometer) 20, and a center radiation thermometer (center pyrometer) 25. As mentioned above, the edge radiation thermometer 20 is a wafer thermometer which receives the infrared radiation emitted from the lower surface of the semiconductor wafer W through the opening 78 of the susceptor 74 to measure the temperature of the semiconductor wafer W, based on the intensity of the infrared radiation. On the other hand, the center radiation thermometer 25 is a susceptor thermometer which receives infrared radiation emitted from a central portion of the susceptor 74 to measure the temperature of the susceptor 74, based on the intensity of the infrared radiation. Although drawn inside the treatment chamber 6 for purposes of illustration in FIG. 3, both the edge radiation thermometer 20 and the center radiation thermometer 25 are mounted to the outer wall surface of the treatment chamber 6 and receive the infrared radiation through respective through holes formed in the outer wall surface.

The flash lamp house 5 provided over the treatment chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash lamp house 5 further includes a lamp light radiation window 53 mounted to the bottom of the enclosure 51. The lamp light radiation window 53 forming the floor of the flash lamp house 5 is a plate-like quartz window made of quartz. The flash lamp house 5 is provided over the treatment chamber 6, whereby the lamp light radiation window 53 is opposed to the upper chamber window 63. The flash lamps FL direct flashes of light from over the treatment chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen lamp house 4 provided under the treatment chamber 6 includes an enclosure 41 incorporating the multiple (in the present preferred embodiment, 40) halogen lamps HL. The halogen lamps HL direct light from under the treatment chamber 6 through the lower chamber window 64 toward the heat treatment space 65.

Figure 9:
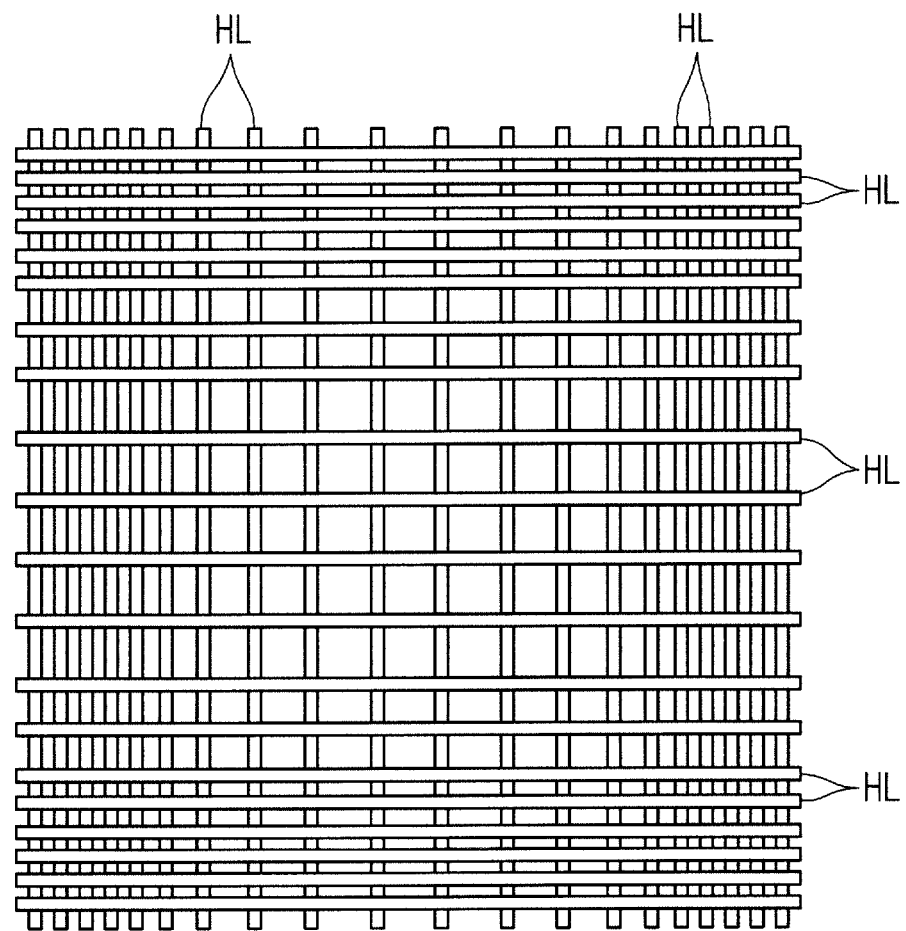
FIG. 9 is a plan view showing an arrangement of halogen lamps.

FIG. 9 is a plan view showing an arrangement of the multiple halogen lamps HL. In the present preferred embodiment, 20 halogen lamps HL are arranged in each of two tiers, i.e. upper and lower tiers. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 9, the halogen lamps HL in each of the upper and lower tiers are disposed at a higher density in a region opposed to the peripheral portion of the semiconductor wafer W held by the holder 7 than in a region opposed to the central portion thereof In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen lamps HL.

The group of halogen lamps HL in the upper tier and the group of halogen lamps HL in the lower tier are arranged to intersect each other in a lattice pattern. In other words, the 40 halogen lamps HL in total are disposed so that the longitudinal direction of each of the halogen lamps HL arranged in the upper tier and the longitudinal direction of each of the halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen lamp house 4 under the halogen lamps HL arranged in two tiers (FIG. 3). The reflector 43 reflects the light emitted from the halogen lamps HL toward the heat treatment space 65.

The heat treatment part 160 further includes, in addition to the aforementioned components, various cooling structures to prevent an excessive temperature rise in the halogen lamp house 4, the flash lamp house 5, and the treatment chamber 6 because of the heat energy generated from the halogen lamps HL and the flash lamps FL during the heat treatment of a semiconductor wafer W. As an example, a water cooling tube (not shown) is provided in the walls of the treatment chamber 6. Also, the halogen lamp house 4 and the flash lamp house 5 have an air cooling structure for forming a gas flow therein to exhaust heat. Air is supplied to a gap between the upper chamber window 63 and the lamp light radiation window 53 to cool down the flash lamp house 5 and the upper chamber window 63.

The controller 3 controls the aforementioned various operating mechanisms provided in the heat treatment apparatus 100. FIG. 10 is a block diagram showing a configuration of the controller 3. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 100 proceed. The controller 3 is shown in the indexer part 101 in FIG. 1. The present invention, however, is not limited to this. The controller 3 may be disposed in any position in the heat treatment apparatus 100.

A liquid crystal touch panel 33 is connected to the controller 3. The touch panel 33 is provided, for example, on an outer wall of the heat treatment apparatus 100. The touch panel 33 displays a variety of pieces of information thereon, and accepts inputs of various commands and parameters. That is, the touch panel 33 function as both a display part and an input part. An operator of the heat treatment apparatus 100 may input commands and parameters via the touch panel 33 while viewing the information appearing on the touch panel 33. A combination of the input part such as a keyboard and a mouse and the display part such as a liquid crystal display may be used in place of the touch panel 33.

The controller 3 is also connected to the edge radiation thermometer 20, the center radiation thermometer 25, and a lamp power supply 45 of the halogen lamp HL. The controller 3 controls the lamp power supply 45 based on a measurement result of the edge radiation thermometer 20 or the center radiation thermometer 25 to adjust output from the halogen lamp HL.

The controller 3 of the heat treatment apparatus 100 is capable of communicating with a host computer 39. The host computer 39 is a controller for managing the entirety of a plurality of heat treatment apparatuses 100 installed in a semiconductor manufacturing plant. The host computer 39 also controls the transport of the carriers C to the plurality of heat treatment apparatuses 100 by means of an OHT (overhead hoist transfer). The communication between the host computer 39 and the controller 3 may be either wired or wireless.

Next, a treatment operation in the heat treatment apparatus 100 according to the present invention will be described. Here, the treatment operation for a semiconductor wafer (product wafer) W that becomes a product will be described first, and then temperature control processing for an in-chamber structure like the susceptor 74 and so on will be described. A semiconductor wafer W to be treated herein is a semiconductor substrate doped with impurities (ions) by an ion implantation process. The impurities are activated by the heat treatment apparatus 100 performing the process of heating (annealing) the semiconductor wafer W by means of flash irradiation.

First, while being stored in a carrier C, untreated semiconductor wafers W implanted with impurities are placed on the first load port 110a or the second load port 110b of the indexer part 101. The transfer robot 120 takes the untreated semiconductor wafers W one by one out of the carrier C to transport each of the untreated semiconductor wafers W into the alignment chamber 231 of the alignment part 230. In the alignment chamber 231, a semiconductor wafer W is rotated in a horizontal plane about a vertical axis passing through the central portion of the semiconductor wafer W, and a notch or the like is optically detected, whereby the orientation of the semiconductor wafer W is adjusted.

Next, the transfer robot 120 of the indexer part 101 takes the orientation-adjusted semiconductor wafer W out of the alignment chamber 231 to transport the semiconductor wafer W into the first cool chamber 131 of the cooling part 130 or the second cool chamber 141 of the cooling part 140. The untreated semiconductor wafer W transported into the first cool chamber 131 or the second cool chamber 141 is transported to the transport chamber 170 by the transport robot 150. The first cool chamber 131 and the second cool chamber 141 function as the paths for transferring the semiconductor wafer W when the untreated semiconductor wafer W is transferred from the indexer part 101 via the first cool chamber 131 or the second cool chamber 141 to the transport chamber 170.

After taking out the semiconductor wafer W, the transport robot 150 pivots so as to face toward the heat treatment part 160. Subsequently, the gate valve 185 opens the space between the treatment chamber 6 and the transport chamber 170, and the transport robot 150 transports the untreated semiconductor wafer W into the treatment chamber 6. At this time, if a preceding semiconductor wafer W subjected to the heating treatment is present in the treatment chamber 6, the untreated semiconductor wafer W is transported into the treatment chamber 6 after one of the transport hands 151a and 151b takes out the semiconductor wafer W subjected to the heating treatment. In this manner, the semiconductor wafers W are interchanged. Thereafter, the gate valve 185 closes the space between the treatment chamber 6 and the transport chamber 170.

The semiconductor wafer W transported into the treatment chamber 6 is preheated by the halogen lamps HL, and is thereafter subjected to the flash heating treatment by flash irradiation from the flash lamps FL. This flash heating treatment activates the impurities implanted in the semiconductor wafer W.

After the completion of the flash heating treatment, the gate valve 185 opens the space between the treatment chamber 6 and the transport chamber 170 again, and the transport robot 150 transports the semiconductor wafer W subjected to the flash heating treatment from the treatment chamber 6 to the transport chamber 170. After taking out the semiconductor wafer W, the transport robot 150 pivots from the treatment chamber 6 so as to face toward the first cool chamber 131 or the second cool chamber 141. The gate valve 185 closes the space between the treatment chamber 6 and the transport chamber 170.

Thereafter, the transport robot 150 transports the semiconductor wafer W subjected to the heating treatment into the first cool chamber 131 of the cooling part 130 or the second cool chamber 141 of the cooling part 140. At this time, the semiconductor wafer W that has passed through the first cool chamber 131 before the heating treatment is also transported into the first cool chamber 131 after the heating treatment, and the semiconductor wafer W that has passed through the second cool chamber 141 before the heating treatment is also transported into the second cool chamber 141 after the heating treatment. In the first cool chamber 131 or the second cool chamber 141, the semiconductor wafer W subjected to the flash heating treatment is cooled. The semiconductor wafer W is cooled to near ordinary temperatures in the first cool chamber 131 or the second cool chamber 141 because the temperature of the entire semiconductor wafer W is relatively high when the semiconductor wafer W is transported out of the treatment chamber 6 of the heat treatment part 160.

After a lapse of a predetermined cooling time period, the transfer robot 120 transports the cooled semiconductor wafer W out of the first cool chamber 131 or the second cool chamber 141, and returns the cooled semiconductor wafer W back to the carrier C. After a predetermined number of treated semiconductor wafers W are stored in the carrier C, the carrier C is transported from the first load port 110a or the second load port 110b of the indexer part 101 to the outside.

The description on the heating treatment in the heat treatment part 160 will be continued. Prior to the transport of the semiconductor wafer W into the treatment chamber 6, the valve 84 is opened for supply of gas, and the valves 89 and 192 for exhaust of gas are opened, so that the supply and exhaust of gas into and out of the treatment chamber 6 start. When the valve 84 is opened, nitrogen gas is supplied through the gas supply opening 81 into the heat treatment space 65. When the valve 89 is opened, the gas within the treatment chamber 6 is exhausted through the gas exhaust opening 86. This causes the nitrogen gas supplied from an upper portion of the heat treatment space 65 in the treatment chamber 6 to flow downwardly and then to be exhausted from a lower portion of the heat treatment space 65.

The gas within the treatment chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment part 160. The amount of nitrogen gas supplied into the heat treatment space 65 is changed as appropriate in accordance with process steps.

Subsequently, the gate valve 185 is opened to open the transport opening 66. The transport robot 150 transports a semiconductor wafer W to be treated through the transport opening 66 into the heat treatment space 65 of the treatment chamber 6. The transport robot 150 moves the transport hand 151a (or the transport hand 151b) holding the untreated semiconductor wafer W forward to a position lying immediately over the holder 7, and stops the transport hand 151a (or the transport hand 151b) thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the untreated semiconductor wafer W is placed on the lift pins 12, the transport robot 150 causes the transport hand 151a to move out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75*a* of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held from below in a horizontal attitude by the susceptor 74 of the holder 7, the 40 halogen lamps HL turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the edge radiation thermometer 20 when the halogen lamps HL perform the preheating. Specifically, the edge radiation thermometer 20 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the edge radiation thermometer 20. The preheating temperature T1 shall be on the order of 600° to 800° C. (in the present preferred embodiment, 700° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the edge radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen lamp house 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL irradiate the front surface of the semiconductor wafer W with a flash of light at the point in time when a predetermined time period has elapsed since the temperature of the semiconductor wafer W reached the preheating temperature T1. At this time, part of the flash of light emitted from the flash lamps FL travels directly toward the interior of the treatment chamber 6. The remainder of the flash of light is reflected once from the reflector 52, and then travels toward the interior of the treatment chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the front surface temperature of the semiconductor wafer W decreases rapidly. Because of the capability of increasing and decreasing the front surface temperature of the semiconductor wafer W in an extremely short time, the flash heating achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After a predetermined time period has elapsed since the completion of the flash heating treatment, the halogen lamps HL turn off. This causes the temperature of the semiconductor wafer W to decrease rapidly from the preheating temperature T1. The edge radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the edge radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport hand 151*b* (or the transport hand 151*a*) of the transport robot 150 transports the treated semiconductor wafer W placed on the lift pins 12 to the outside. The transport robot 150 moves the transport hand 151b forward to a position lying immediately under the semiconductor wafer W thrust upwardly by the lift pins 12, and stops the transport hand 151b thereat. Then, the pair of transfer arms 11 of the transfer mechanism 10 moves downwardly, whereby the semiconductor wafer W subjected to the flash heating is transferred to and placed on the transport hand 151b. Thereafter, the transport robot 150 causes the transport hand 151b to move out of the treatment chamber 6, thereby transporting the treated semiconductor wafer W to the outside.

Typically, the treatment of semiconductor wafers W is performed on a lot-by-lot basis. The term "lot" refers to a group of semiconductor wafers W subjected to the same treatment under the same conditions. In the heat treatment apparatus 100 according to the present preferred embodiment, multiple (e.g., 25) semiconductor wafers W in a lot are placed on the first load port 110a or the second load port 110b of the indexer part 101 while being stored in one carrier C, and are sequentially transported one by one into the treatment chamber 6 and subjected to the heating treatment.

For the start of the treatment of a lot in the heat treatment apparatus 100 that has not performed the treatment for some period of time, the first semiconductor wafer W in the lot is transported into the treatment chamber 6 that is at approximately room temperature and is then subjected to the preheating and the flash heating treatment. Examples of this case are such that the heat treatment apparatus 100 starts up after maintenance and then treats the first lot or such that a long time period has elapsed since the treatment of the preceding lot. During the heating treatment, heat transfer occurs from the semiconductor wafer W increased in temperature to in-chamber structures (structures in the chamber) including the susceptor 74 and the like. For this reason, the temperature of the susceptor 74 that is initially at room temperature increases gradually due to heat storage as the number of treated semiconductor wafers W increases. Also, part of infrared radiation emitted from the halogen lamps HL is absorbed by the lower chamber window 64. For this reason, the temperature of the lower chamber window 64 increases gradually as the number of treated semiconductor wafers W increases.

When the heating treatment is performed on approximately ten semiconductor wafers W, the temperature of the susceptor 74 and the lower chamber window 64 reaches a constant stabilized temperature. In the susceptor 74 the temperature of which reaches the stabilized temperature, the amount of heat transferred from the semiconductor wafer W to the susceptor 74 and the amount of heat dissipated from the susceptor 74 are balanced with each other. Before the temperature of the susceptor 74 reaches the stabilized temperature, the amount of heat transferred from the semiconductor wafer W to the susceptor 74 is greater than the amount of heat dissipated from the susceptor 74, so that the temperature of the susceptor 74 increases gradually due to heat storage as the number of treated semiconductor wafers W increases. On the other hand, after the temperature of the susceptor 74 reaches the stabilized temperature, the amount of heat transferred from the semiconductor wafer W to the susceptor 74 and the amount of heat dissipated from the susceptor 74 are balanced with each other, so that the temperature of the susceptor 74 is maintained at the constant stabilized temperature. The stabilized temperature of the in-chamber structures including the susceptor 74 and the like refers to the temperature of the in-chamber structures obtained when the heating treatment of a plurality of semiconductor wafers W in a lot in succession within the treatment chamber 6 without preheating of the in-chamber structures causes the temperature of the in-chamber structures to increase to a constant temperature. After the temperature of the lower chamber window 64 reaches the stabilized temperature, the amount of heat that the lower chamber window 64 absorbs from the light emitted from the halogen lamps HL and the amount of heat released from the lower chamber window 64 are balanced with each other, so that the temperature of the lower chamber window 64 is also maintained at the constant stabilized temperature.

If the treatment is started in the treatment chamber 6 that is at room temperature in this manner, there has been a problem that a non-uniform temperature history results from a difference in temperature of the structures in the treatment chamber 6 between initial semiconductor wafers W in the lot and intermediate semiconductor wafers W in the lot. Also, there have been cases in which wafer warpage occurs in the initial semiconductor wafers W because the flash heating treatment is performed on the initial semiconductor wafers W supported by the susceptor 74 that is at a low temperature. To solve these problems, dummy running (dummy treatment) has been conventionally performed prior to the start of the treatment of a product lot. The dummy running (dummy treatment) is a technique in which dummy wafers DW not to be treated are transported into the treatment chamber 6 and are subjected to the heating treatment, whereby the temperature of the in-chamber structures including the susceptor 74 and the like is increased to the stabilized temperature. However, a considerable long time is required to perform dummy treatment in the treatment chamber 6 at room temperature to raise temperature of the in-chamber structure like the susceptor 74 and so on to a stable temperature. Thus, treatment of a lot cannot be started during the treatment, so that throughput may be reduced. The dummy treatment according to the present preferred embodiment will be described below.

Figure 11:
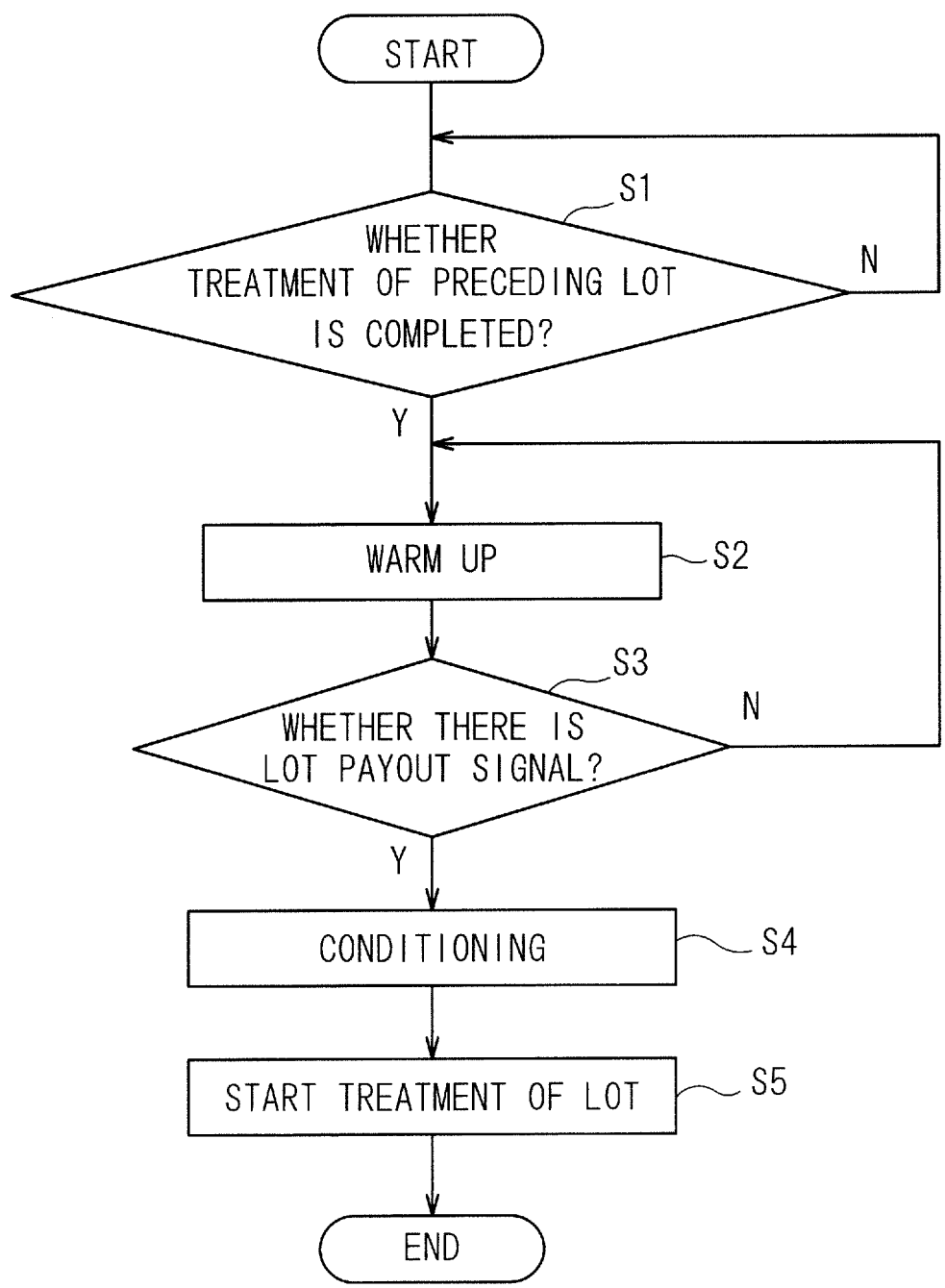
FIG. 11 is a flow diagram showing a procedure for dummy treatment.

FIG. 11 is a flow diagram showing a procedure for the dummy treatment. First, the dummy treatment is not performed until treatment of the preceding lot is completed (step S1). When the treatment of the last semiconductor wafer W of the preceding lot is completed and the semiconductor wafer W is transported from the treatment chamber 6, the heat treatment apparatus 100 enters a standby state and the procedure immediately proceeds from step S1 to step S2 to start warm up treatment. When the warm up treatment is started, a dummy wafer DW is transported by the transfer robot 120 and the transport robot 150 from the dummy carrier DC installed on the third load port 110c to the treatment chamber 6 of the heat treatment part 160.

The dummy wafers DW are disk-shaped silicon wafers similar to the semiconductor wafers W that become products, and are similar in size and shape to the semiconductor wafers W. The dummy wafers DW, however, are neither patterned nor implanted with ions. That is, the dummy wafers DW are so-called silicon bare wafers. The type of the dummy carrier DC for storing the dummy wafers DW is the same as that of the carriers C for storing the semiconductor wafers W that become products therein, and is a FOUP in the present preferred embodiment. The dummy carrier DC, however, is a carrier exclusive to the dummy wafers DW, and stores only the dummy wafers DW therein.

The dummy wafer DW transported into the treatment chamber 6 is transferred to the susceptor 74 made of quartz and held in a horizontal posture in the same procedure as the semiconductor wafer W described above. The halogen lamp HL is turned on while the dummy wafer DW is held on the susceptor 74. The dummy wafer DW is heated by light irradiation from the halogen lamp HL, and the susceptor 74 is also heated by heat conduction and heat radiation from the dummy wafer DW having increased in temperature. In addition, a part of the light emitted from the halogen lamp HL is directly absorbed by the susceptor 74, and the susceptor 74 is also increased in temperature by this. Further, a part of the light emitted from the halogen lamp HL is also absorbed by the lower chamber window 64, whereby the lower chamber window 64 is also increased in temperature. In this way, in the warm up treatment, the in-chamber structure like the susceptor 74 and so on is heated directly or indirectly by light irradiation from the halogen lamp HL.

When the warm up treatment is performed, the controller 3 controls output from the halogen lamp HL based on temperature of the susceptor 74 measured by the center radiation thermometer 25. More specifically, the controller 3 effects feedback control of the output from the halogen lamp HL based on a measurement result of temperature of the susceptor 74 with the center radiation thermometer 25 so that the temperature of the susceptor 74 becomes a heat-retaining temperature T3. The heat-retaining temperature T3 is lower than a stable temperature of the susceptor 74 in the subsequent lot. After the temperature of the susceptor 74 measured by the center radiation thermometer 25 reaches the heat-retaining temperature T3, the controller 3 controls the output from the halogen lamp HL so that the susceptor 74 maintains the constant heat-retaining temperature T3. In other words, the warm up treatment is a treatment for keeping the in-chamber structure like the susceptor 74 and so on at a relatively low constant heat-retaining temperature.

The warm up treatment is continued until a lot payout signal is received from the host computer 39 (step S3). The host computer 39 manages the entirety of the plurality of heat treatment apparatuses 100 installed in the semiconductor manufacturing plant, and controls the transport of the carriers C by means of the OHT in the semiconductor manufacturing plant. When causing the heat treatment apparatus 100 to treat a product lot, the host computer 39 causes the OHT to transport a carrier C with untreated semiconductor wafers W stored therein to the heat treatment apparatus 100. Carriers C with untreated semiconductor wafers W stored therein are collected in a storage shed in the semiconductor manufacturing plant. The host computer 39 instructs the OHT to transport a carrier C with untreated semiconductor wafers W stored therein from the storage shed to the heat treatment apparatus 100. Then, the host computer 39 instructs the OHT to transport the carrier C, and at the same time transmits a lot payout signal, indicating that an untreated lot has been paid out from the storage shed, to the heat treatment apparatus 100.

Even when the heat treatment apparatus 100 receives the lot payout signal, the carrier C is not immediately transported into the heat treatment apparatus 100. The OHT is responsible for transporting carriers C to the multiplicity of heat treatment apparatuses 100 installed in the semiconductor manufacturing plant. Typically, it takes several minutes for the OHT to transport the carrier C into the heat treatment apparatus 100 after receiving the instruction from the host computer 39. In the present preferred embodiment, a conditioning treatment is performed through the use of the time interval between the instant at which the host computer 39 instructs the OHT to transport the carrier C with untreated semiconductor wafers W stored therein and the instant at which the carrier C is transported into the heat treatment apparatus 100. Specifically, when the controller 3 of the heat treatment apparatus 100 receives the lot payout signal transmitted from the host computer 39, the procedure proceeds from step S3 to step S4 in which the conditioning treatment is started.

When the conditioning treatment is started, the dummy wafer DW used in the warm up treatment is transported from the treatment chamber 6 and a new dummy wafer DW is transported from the dummy carrier DC to the treatment chamber 6. The dummy wafer DW transported into the treatment chamber 6 is transferred to the susceptor 74 and held in a horizontal posture. Even in the conditioning treatment, the halogen lamp HL is turned on while the dummy wafer DW is held on the susceptor 74. The dummy wafer DW is heated by light irradiation from the halogen lamp HL, and the susceptor 74 is also heated by heat conduction and heat radiation from the dummy wafer DW having increased in temperature. In addition, a part of the light emitted from the halogen lamp HL is also absorbed by the susceptor 74 and the lower chamber window 64, so that they are heated. That is, even in the conditioning treatment, the in-chamber structure like the susceptor 74 and so on is heated directly or indirectly by light irradiation from the halogen lamp HL.

When the conditioning treatment is performed, the controller 3 controls output from the halogen lamp HL based on temperature of the dummy wafer DW held by the susceptor 74, measured by the edge radiation thermometer 20. Specifically, the controller 3 effects feedback control of the output from the halogen lamp HL based on a measurement result of temperature of the dummy wafer DW with the edge radiation thermometer 20 so that a temperature of the dummy wafer DW becomes a preheating temperature T1 for a semiconductor wafer W included in a lot to be treated next. Then, after the temperature of the dummy wafer DW reaches the preheating temperature T1, the halogen lamp HL is temporarily turned off.

After the halogen lamp HL is turned off, the dummy wafer DW is transported from the treatment chamber 6 and a new dummy wafer DW is transported into the treatment chamber 6. That is, the dummy wafer DW is exchanged. Then, after the new dummy wafer DW is held by the susceptor 74, the halogen lamp HL is turned on again, and the dummy wafer DW is heated by light irradiation from the halogen lamp HL. Accordingly, the in-chamber structure like the susceptor 74 and so on is heated as described above.

At this time, the controller 3 also controls the output from the halogen lamp HL based on temperature of the dummy wafer DW measured by the edge radiation thermometer 20 so that the temperature of the dummy wafer DW becomes the preheating temperature T1 for the semiconductor wafer W included in the lot to be treated next. Then, after the temperature of the dummy wafer DW reaches the preheating temperature T1, the halogen lamp HL is turned off again.

Thereafter, the conditioning treatment as described above is repeatedly performed on a plurality of the dummy wafers DW. In other words, in the conditioning treatment, the halogen lamp HL is repeatedly turned on and off to repeat light irradiation similar to preheating for the semiconductor wafer W included in the lot to be treated next. The conditioning treatment as described above causes temperature of the in-chamber structure like the susceptor 74 and so on to be controlled so as to gradually approach the stable temperature from the heat-retaining temperature by being repeatedly raised and lowered.

Next, after the carrier C containing the lot to be treated is placed on the first load port 110a or the second load port 110b by OHT, the treatment for the semiconductor wafer W included in the lot is started (step S5). The heat treatment for the semiconductor wafer W is as described above, and is performed according to a preset treatment procedure and treatment conditions. The first semiconductor wafer W of the lot is held on the susceptor 74 that has been temperature-controlled to the stable temperature by the warm up treatment and the conditioning treatment. This enables providing a uniform heat treatment history for all of the semiconductor wafers W constituting the lot.

In the present preferred embodiment, the dummy treatment for raising the temperature of the in-chamber structure like the susceptor 74 and so on to a stable temperature is performed in two stages. That is, after treatment of a preceding lot is completed, the heat treatment apparatus 100 is put on standby while performing the warm up treatment for keeping the in-chamber structure like the susceptor 74 and so on at a constant heat-retaining temperature as a first stage. Then, before starting treatment of a subsequent lot, the conditioning treatment that repeats light irradiation similar to that performed on the semiconductor wafer W included in the lot is performed as a second stage to temperature-control the in-chamber structure to a stable temperature. After the warm up treatment for keeping the in-chamber structure at the heat-retaining temperature is performed, the conditioning treatment that repeats light irradiation similar to that performed on the semiconductor wafer W included in the lot is performed as described above. Accordingly, the in-chamber structure can be temperature-controlled to the stable temperature in a short time compared to the conventional dummy treatment. As a result, decrease in throughput in the heat treatment apparatus 100 can be suppressed.

In addition, the treatment of the first semiconductor wafer W of the lot is started after the in-chamber structure like the susceptor 74 and so on is temperature-controlled to the stable temperature by the warm up treatment and the conditioning treatment, so that all the semiconductor wafers W constituting the lot are held by the susceptor 74 at the stable temperature, and thus can have a uniform heat treatment history.

While the preferred embodiment according to the present invention has been described hereinabove, various modifications of the present invention in addition to those described above may be made without departing from the scope and spirit of the invention. For example, in the aforementioned preferred embodiment, the warm up treatment is performed by light irradiation from the halogen lamp HL while the dummy wafer DW is held on the susceptor 74. Instead, the warm up treatment may be performed by light irradiation from the halogen lamp HL while no dummy wafer DW is held on the susceptor 74. In this case, a part of the light emitted from the halogen lamp HL is directly absorbed by the susceptor 74 or the like, so that the in-chamber structure like the susceptor 74 and so on is kept at a heat-retaining temperature. However, the transparent quartz susceptor 74 does not absorb much light emitted from the halogen lamp HL, so that the in-chamber structure like the susceptor 74 and so on can be efficiently increased in temperature by using the dummy wafer DW as in the aforementioned preferred embodiment.

While in the conditioning treatment, the light irradiation from the halogen lamp HL is repeatedly performed on a plurality of dummy wafers DW, the light irradiation may be repeatedly performed on one dummy wafer DW by repeatedly turning on and off the halogen lamp HL without exchanging the dummy wafer DW. Alternatively, the conditioning treatment may be performed on the susceptor 74 by repeating light irradiation from the halogen lamp HL without holding the dummy wafer DW on the susceptor 74.

In other words, the conditioning treatment may be performed such that the halogen lamp HL is repeatedly turned on and off to repeat light irradiation similar to that performed on the semiconductor wafer W included in the lot to be treated and the in-chamber structure like the susceptor 74 and so on is temperature-controlled to the stable temperature.

The heat treatment apparatus 100 performing the warm up treatment may receive a signal to change a recipe from the host computer 39 during a standby state. The recipe defines a treatment procedure and treatment conditions for heat treatment on the semiconductor wafer W. Thus, when the recipe is changed, the preheating temperature T1 and the treatment temperature T2 for the semiconductor wafer W included in the lot to be treated next are often changed. When the signal to change the recipe is received during the warm up treatment as described above, the controller 3 may change the heat-retaining temperature of the in-chamber structure like the susceptor 74 and so on in the warm up treatment. For example, when the preheating temperature T1 and the treatment temperature T2 for the semiconductor wafer W are changed to increase, the controller 3 changes also the heat-retaining temperature of the in-chamber structure like the susceptor 74 and so on to a higher temperature. Conversely, when the preheating temperature T1 and the treatment temperature T2 for the semiconductor wafer W are changed to decrease, the controller 3 changes also the heat-retaining temperature of the in-chamber structure like the susceptor 74 and so on to a lower temperature. The controller 3 controls the output from the halogen lamp HL so that the susceptor 74 or the like maintains the changed heat-retaining temperature.

Although the 30 flash lamps FL are provided in the flash lamp house 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen lamp house 4 is not limited to 40. Any number of halogen lamps HL may be provided.

In the aforementioned preferred embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating. In this case, the warm up treatment as well as the conditioning treatment is performed by light irradiation from an arc lamp.

Moreover, a substrate to be treated by the heat treatment apparatus 100 is not limited to a semiconductor wafer, but may be a glass substrate for use in a flat panel display for a liquid crystal display apparatus and the like, and a substrate for a solar cell.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for irradiating a substrate with light to heat the substrate, the heat treatment method comprising the steps:

(a) transporting a substrate into a chamber;
(b) irradiating the substrate held by a susceptor in said chamber with light;

(c) keeping a structure in said chamber at a constant heat-retaining temperature by irradiation with light from a continuous lighting lamp before a first substrate of a lot is transported into said chamber; and (d) controlling temperature of said structure by repeatedly turning on and off said continuous lighting lamp after said step (c), wherein said temperature controlling step (d) is commenced at a point of time when a payout signal of said lot is received.

2. The heat treatment method according to claim 1, wherein in said step (d), light irradiation similar to light irradiation performed on the substrate included in said lot is repeated from said continuous lighting lamp while a dummy wafer is held on said susceptor.

3. The heat treatment method according to claim 2, wherein in said step (c), light irradiation is performed from said continuous lighting lamp while a dummy wafer is held on said susceptor.

4. The heat treatment method according to claim 3, wherein in said step (c), output from said continuous lighting lamp is controlled based on temperature of said susceptor, and in said step (d), the output from said continuous lighting lamp is controlled based on temperature of the dummy wafer held on said susceptor.

5. The heat treatment method according to claim 1, wherein said heat-retaining temperature is changed when a signal to change treatment temperature of said lot is received while said step (c) is performed.

6. A heat treatment apparatus for irradiating a substrate with light to heat the substrate, the heat treatment apparatus comprising:

a chamber that accommodates a substrate;

a susceptor that holds the substrate in said chamber;

a continuous lighting lamp that irradiates the substrate held by said susceptor with light; and a controller that controls output from said continuous lighting lamp, wherein a structure in said chamber is maintained at a constant heat-retaining temperature by light irradiation from said continuous lighting lamp in a heat-retaining step, and thereafter said structure is temperature-controlled by repeatedly turning on and off said continuous lighting lamp in a temperature control step before a first substrate of a lot is transported to said chamber; and said temperature controlling step (d) is commenced at a point of time when a payout signal of said lot is received.

7. The heat treatment apparatus according to claim 6, wherein in said temperature control step, light irradiation similar to light irradiation performed on the substrate included in said lot is repeated from said continuous lighting lamp while a dummy wafer is held on said susceptor.

8. The heat treatment apparatus according to claim 7, wherein in said heat-retaining step, light irradiation is performed from said continuous lighting lamp while a dummy wafer is held on said susceptor.

9. The heat treatment apparatus according to claim 8, further comprising:

a first thermometer for measuring temperature of said susceptor; and a second thermometer for measuring temperature of a dummy wafer held by said susceptor, wherein in said heat-retaining step, said controller controls output from said continuous lighting lamp based on temperature of said susceptor measured by said first thermometer, and in said temperature control step, said controller controls the output from said continuous lighting lamp based on temperature of said dummy wafer held on said susceptor, measured by said second thermometer.

10. The heat treatment apparatus according to claim 6, wherein said heat-retaining temperature is changed when a signal to change treatment temperature of said lot is received while said heat-retaining step is performed.

* * * * *